US 6,704,165 B2

(12) United States Patent
Kube et al.

(10) Patent No.: US 6,704,165 B2
(45) Date of Patent: Mar. 9, 2004

(54) ATTACHMENT OF A HEAD-GIMBAL ASSEMBLY TO A PRINTED CIRCUIT BOARD ACTUATOR ARM USING Z-AXIS CONDUCTIVE ADHESIVE FILM

(75) Inventors: Todd W. Kube, Boulder, CO (US); Bruce Lynn Blakeslee, Golden, CO (US); Alexander Wei Chang, Longmont, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/015,240

(22) Filed: Dec. 11, 2001

(65) Prior Publication Data

US 2002/0186508 A1 Dec. 12, 2002

Related U.S. Application Data

(60) Provisional application No. 60/297,159, filed on Jun. 8, 2001.

(51) Int. Cl.$^7$ .................................................. G11B 5/48
(52) U.S. Cl. .................................. 360/245.9; 360/245.4
(58) Field of Search ........................... 360/245.9, 245.8, 360/244.2–244.4, 244.7, 264.2, 266.3, 265.9, 245.4

(56) References Cited

U.S. PATENT DOCUMENTS

| | | | | |
|---|---|---|---|---|
| 4,667,401 A | * | 5/1987 | Clements et al. .............. 29/832 |
| 4,829,395 A | | 5/1989 | Coon et al. |
| 4,970,624 A | * | 11/1990 | Arneson et al. ............. 361/749 |
| 5,014,145 A | * | 5/1991 | Hosokawa et al. ....... 360/244.1 |
| 5,068,714 A | * | 11/1991 | Seipler ........................ 257/703 |
| 5,225,949 A | | 7/1993 | King et al. |
| 5,452,151 A | * | 9/1995 | Money et al. ................. 360/75 |
| 5,539,596 A | * | 7/1996 | Fontana et al. .......... 360/244.4 |
| 5,677,815 A | * | 10/1997 | Chan ....................... 360/265.7 |
| 5,734,523 A | | 3/1998 | Scheidecker et al. |
| 5,759,418 A | | 6/1998 | Frater et al. |
| 5,768,062 A | * | 6/1998 | Anderson et al. ........ 360/245.9 |
| 5,786,962 A | | 7/1998 | Kawazoe |
| 5,808,835 A | | 9/1998 | Fujiwara |
| 5,841,609 A | | 11/1998 | Tochiyama |
| 5,871,655 A | | 2/1999 | Lee et al. |
| 5,877,919 A | | 3/1999 | Foisy et al. |
| 5,961,334 A | * | 10/1999 | Inaba .......................... 439/67 |
| 5,991,123 A | | 11/1999 | Casey |
| 6,021,023 A | | 2/2000 | Hillman |
| 6,134,084 A | * | 10/2000 | Ohwe et al. ............. 360/244.1 |
| 6,172,852 B1 | | 1/2001 | Boutaghou et al. |
| 6,201,667 B1 | * | 3/2001 | Yamamoto et al. ...... 360/264.2 |
| 6,215,625 B1 | | 4/2001 | Carlson |
| 6,238,777 B1 | | 5/2001 | Oda et al. |
| 6,265,674 B1 | | 7/2001 | Kato |
| 6,281,448 B1 | | 8/2001 | Tsukamoto |
| 6,477,016 B1 | * | 11/2002 | Yamaguchi et al. ..... 360/264.2 |

\* cited by examiner

*Primary Examiner*—Brian E. Miller
(74) *Attorney, Agent, or Firm*—Derek J. Berger

(57) ABSTRACT

Method and apparatus for forming a disc drive actuator assembly. A rigid actuator arm formed of printed circuit board (PCB) material is configured for placement over a rotatable disc. A head-gimbal assembly (HGA) is provided comprising a data transducing head, a flexible suspension assembly and a conductor which is connected to the head and routed along the flexible suspension assembly. A Z-axis conductive adhesive film is used to mechanically and electrically connect the HGA with a distal end of the PCB actuator arm. The Z-axis conductive adhesive film is substantially conductive across the thickness of the film and is substantially nonconductive along the length and width of the film. In a preferred embodiment, the film establishes a grounding path to dissipate electrostatic charge in the HGA. In another embodiment, the film establishes a data signal path for the head.

25 Claims, 5 Drawing Sheets

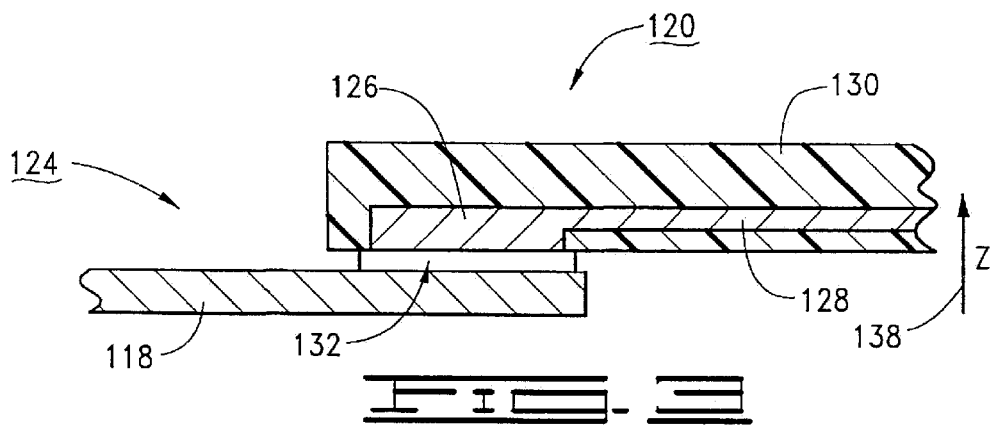
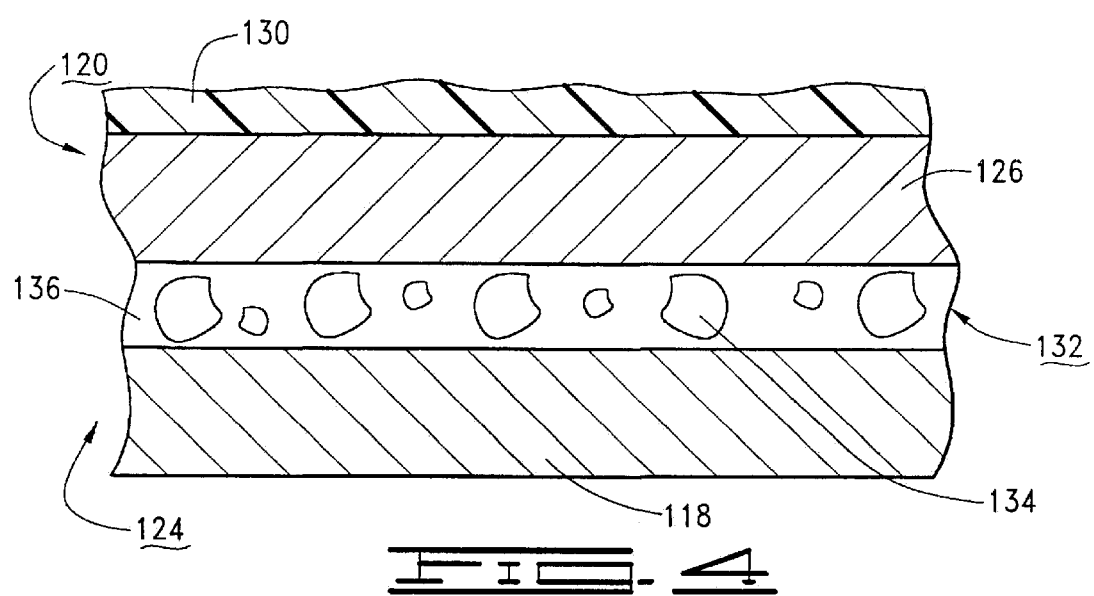
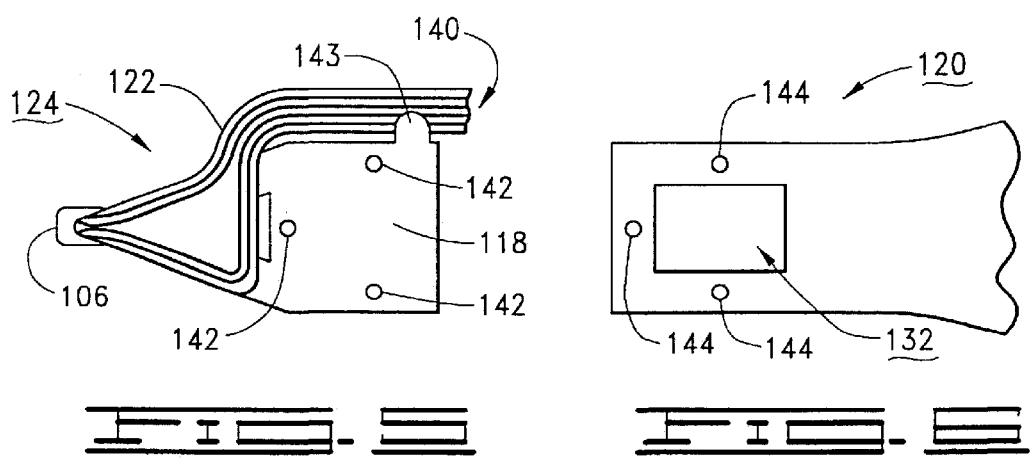

ATTACHMENT OF A HEAD-GIMBAL ASSEMBLY TO A PRINTED CIRCUIT BOARD ACTUATOR ARM USING Z-AXIS CONDUCTIVE ADHESIVE FILM

RELATED APPLICATIONS

This application claims priority to U.S. Provisional Application No. 60/297,159 filed Jun. 8, 2001.

FIELD OF THE INVENTION

The claimed invention relates generally to disc drive data storage devices and more particularly to a disc drive actuator which uses a Z-axis conductive adhesive film to electrically and mechanically interconnect a head-gimbal assembly (HGA) to a printed circuit board (PCB) actuator arm.

BACKGROUND OF THE INVENTION

Data storage devices of the type known as "Winchester" disc drives are well known in the industry. Such disc drives magnetically record digital data on circular, concentric data tracks on the surfaces of one or more rigid rotatable storage discs. The discs are axially aligned and mounted on the hub of a spindle motor for rotation at a constant, high speed.

Data are recorded to and retrieved from the discs by an array of vertically aligned read/write head assemblies, or heads, which are controllably positioned adjacent the disc surfaces by an actuator assembly. The actuator assembly typically comprises a rotary voice coil construction so that the actuator assembly rotates about a central pivot axis adjacent the discs through application of current to a coil of a voice coil motor (VCM).

The actuator assembly includes a number of rigid actuator arms which project out over the disc surfaces. Flexible suspension assemblies project from the distal ends of the actuator arms. A head is in turn suspended at the distal end of each suspension assembly. The suspension assemblies operate as springs to bias the heads toward the disc surfaces.

Each head typically includes electromagnetic transducer read and write elements which are carried on an air bearing slider. The slider acts in a cooperative hydrodynamic relationship with a thin layer of air dragged along by the spinning discs to fly each head in a closely spaced relationship to the disc surface. Conductors (such as in a laminated flex circuit) are routed along the suspension assemblies to provide electrical conductive paths for the read and write elements. For reference, the heads, sliders, suspension assemblies and conductors are collectively referred to as head gimbal assemblies, or HGAs.

Most commonly, the flexures are mounted to the actuator arms using mechanical swaging as taught in U.S. Pat. No. 4,829,395 issued to Coon. Mechanical swaging is appropriate where both the actuator arms and the HGAs are made of metallic material, such as aluminum or magnesium. The metal-to-metal contact between the HGAs and the actuator arms obtained through swaging techniques ensures an adequate electrical grounding path between these components.

Certain recent designs for actuators have included actuator arms made from multi-layer printed circuit boards (PCB) instead of a homogenous metal. These designs are advantageous because a number of individual components and the associated electrical interconnects between components can be minimized. However, conventional HGA-arm attachment methodologies such as swaging are not always practical, or even feasible, to implement when the actuator arm has a PCB construction.

SUMMARY OF THE INVENTION

In accordance with preferred embodiments, a disc drive is provided with at least one rotatable disc and an actuator assembly adjacent the disc. The actuator assembly includes a rigid printed circuit board (PCB) actuator arm formed of a printed circuit board material, and a flexible head-gimbal assembly (HGA). The HGA preferably comprises a data transducing head, a flexible suspension assembly and a flex circuit including a conductor which is routed along the flexible suspension assembly and connected to the head.

A Z-axis conductive adhesive film is used to electrically and mechanically attach the HGA to a distal end of the PCB actuator arm. The film provides a low resistance electrically conductive path in a first direction across the layer from the HGA to the actuator arm, and at the same time is substantially nonconductive in a second direction normal to the first direction.

In a preferred embodiment, the Z-axis conductive adhesive film is used to affix the flexible suspension assembly to the actuator arm to provide a grounding path to dissipate electrostatic charge in the HGA. In another preferred embodiment, the Z-axis conductive adhesive film is used to affix the flex circuit to the actuator arm to provide a data signal path for the head.

The actuator assembly is preferably formed by steps of providing the PCB actuator arm and the HGA, applying the Z-axis conductive adhesive film to at least a selected one of the PCB actuator arm and the HGA, pressing the HGA onto the PCB actuator arm, and heating the film to establish the desired mechanical and electrical interconnections between the HGA and the PCB actuator arm.

These and various other features as well as advantages that characterize the claimed invention will become apparent upon reading the following detailed description and upon reviewing the associated drawings.

BRIEF DESCRIPTION OF THE DRAWINGS

FIG. 3 is an elevational, cross-sectional view of the PCB actuator arm and a head gimbal assembly (HGA) of the actuator of FIG. 1 which are interconnected using a Z-axis conductive adhesive.

FIG. 4 is a magnified schematic view of the Z-axis conductive adhesive, the HGA and the PCB actuator arm of FIG. 3.

FIG. 5 is a plan schematic view of the HGA of FIG. 3.

FIG. 6 is a plan schematic view of the distal end of the PCB actuator arm of FIG. 3.

DETAILED DESCRIPTION

Figure 1:
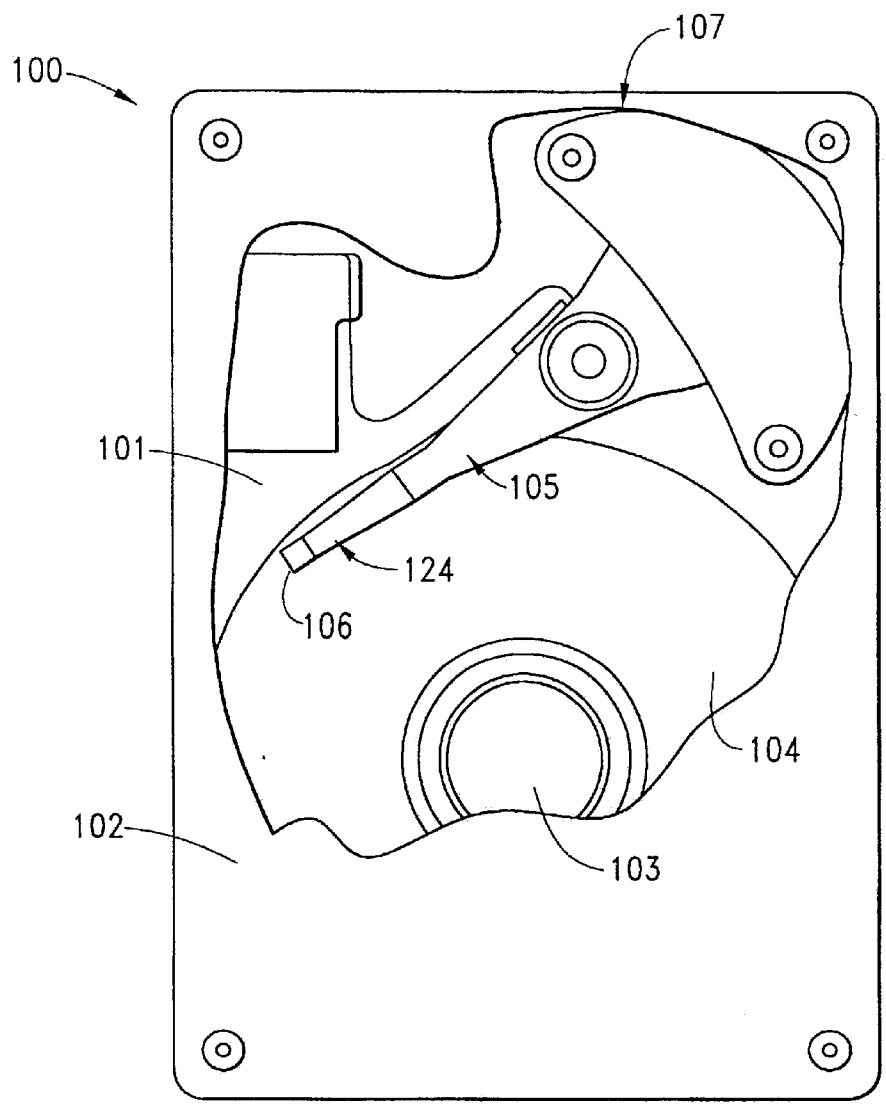
FIG. 1 is a plan view of a disc drive constructed in accordance with preferred embodiments of the present invention.

An exemplary disc drive 100 constructed in accordance with preferred embodiments of the present invention is generally set forth in FIG. 1. As in a conventional disc drive system, the disc drive 100 includes a base deck 101 which cooperates with a top cover 102 (shown partially cut away) to form an internal environment for the drive. A spindle motor 103 rotates a number of rigid data recording discs 104 at a constant high speed. A rotary actuator 105 supports a number of data transducing heads 106 adjacent data recording surfaces of the discs 104. The actuator 105 is rotated using a voice coil motor (VCM) 107.

Figure 2:
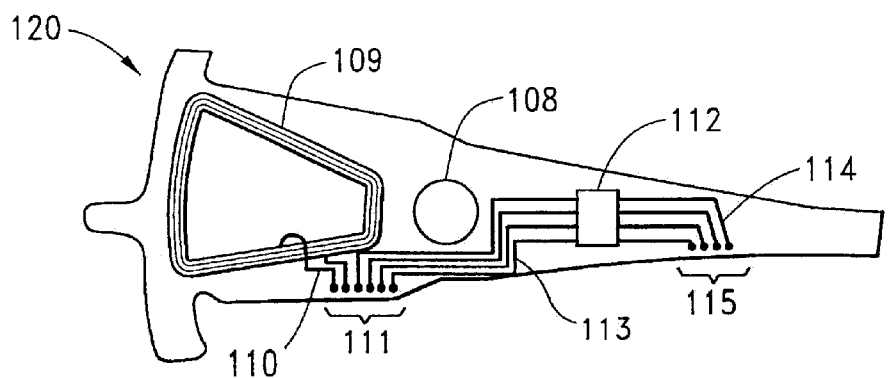
FIG. 2 is a plan view of a printed circuit board (PCB) actuator arm of the actuator of FIG. 1.

Unlike conventional disc drive systems, however, the actuator 105 has a printed circuit board (PCB) construction and includes a number of stacked PCB actuator arms 120, one of which is shown in greater detail in FIG. 2. The PCB actuator arms 120 each include a central aperture to accommodate a bearing shaft assembly (not shown). A voice coil 109 is embedded within exterior surfaces of the PCB actuator arm 120. In addition, the following electrical components are embedded within and between exterior surfaces of the actuator arm 120: conductors 110 leading from the voice coil 109 to an exterior surface of the actuator arm 120, forming contacts 111 for connection to a flex circuit assembly (not shown in FIG. 2); a preamplifier driver circuit 112 (preamp) which amplifies read signals generated by a selected head 106 (FIG. 1) during a read operation and which applies write currents to the head during a write operation; conductors 113 leading from the preamp 112 to the contacts 111 for connection to the flex circuit assembly; and conductors 114 leading from the preamp to an exterior surface of the actuator arm 120 to form contacts 115 for interconnection with the head.

As will be recognized, the heads 106 are provided with air-bearing surfaces (sliders) to allow the heads to fly over the disc surfaces on air currents established by the rotation of the discs 104. The heads 106 are supported by flexible suspension assemblies, or flexures (118, as shown in FIG. 4) which bias the heads 106 toward the discs 104. A flex circuit (122, as shown in FIG. 4) extends along each of the flexures 118 and actuator arms 120 to provide conductive paths for read and write elements in the heads 106. For reference, each set of heads 106, flexures 118 and flex circuits 122 is collectively referred to herein as a head-gimbal assembly (HGA) 124.

The PCB actuator arms 120 are made from printed circuit board (PCB) material. A typical PCB is manufactured as a composite material made of glass fiber and epoxy resin. The PCB is typically a multi-layer structure, consisting of conductive patterns defined in an insulating layer placed on a substrate. The substrate is typically a board formed from a glass-epoxy resin. The insulating layer is also typically made of glass-epoxy resin. The conductive patterns are usually copper, but may be formed of any conductive material, such as silver, gold, or a metal alloy. The use of PCB material to form the actuator arms provides several important advantages as compared to the use of a homogenous metal material (such as aluminum), including improved damping characteristics, reduced mass and the ability to internally embed circuitry and electrical connection paths, as shown in FIG. 2.

FIGS. 3 and 4 show the topmost actuator arm 120 and HGA 124 of FIG. 1 in greater detail (the flex circuit 122 of the HGA 124 has been omitted from FIG. 3 for simplicity of illustration). The PCB actuator arm 120 includes an exposed copper pad 126 and an adjoining, embedded electrical trace 128 supported by a rigid, dielectric substrate material 130.

A thin layer of Z-axis conductive adhesive film 132 is used to electrically and mechanically interconnect the HGA 124 with the actuator arm 120. The film 132, pad 126 and trace 128 provide an electrically conductive path from the flexure 118 to an electrical ground (not shown) to prevent the build-up of an electrostatic charge.

As shown in FIG. 3, the film 132 includes electrically conductive particles 134 distributed throughout a thermoplastic or thermoset dielectric adhesive layer 136. The particles 134 provide an electrically conducting path between the flexure 118 and the copper pad 126 in the Z-axis (as indicated at 138). However, the particles are spaced sufficiently far apart to ensure that the film is substantially electrically nonconductive in a plane defined by the thickness of the Z-axis adhesive film 124 (i.e., along a plane normal to the Z-axis 138). Suitable Z-axis conductive adhesive films are commercially available from the Minnesota Manufacturing and Mining Company (3M), Minneapolis, Minn., USA, model nos. 5303 and 5352.

FIG. 5 provides a top plan view of the HGA 124 and FIG. 6 provides a bottom plan view of the distal end of the PCB actuator arm 120 to illustrate the respective mating surfaces of these components. For reference, conductive traces 140 are shown in the flex circuit 122 of the HGA 124 to route read and write signals from the head 106. A tab 143 projects from the flexure 118 to support and to provide strain relief for the flex circuit 122.

Alignment pins 142 project from the flexure 118 and engage plated-through-holes 144 in the actuator arm 120 to align the HGA 124 with the actuator arm 120. Any number of suitable methodologies can be employed to align the HGA 124 with the actuator arm 120 besides that shown in FIGS. 5–6. Once the HGA 124 is pressed onto the film 132, heat is applied to cause the adhesive layer 136 to flow and bring the particles 134 into contact with the flexure 118 and the copper trace 126.

Figure 7:
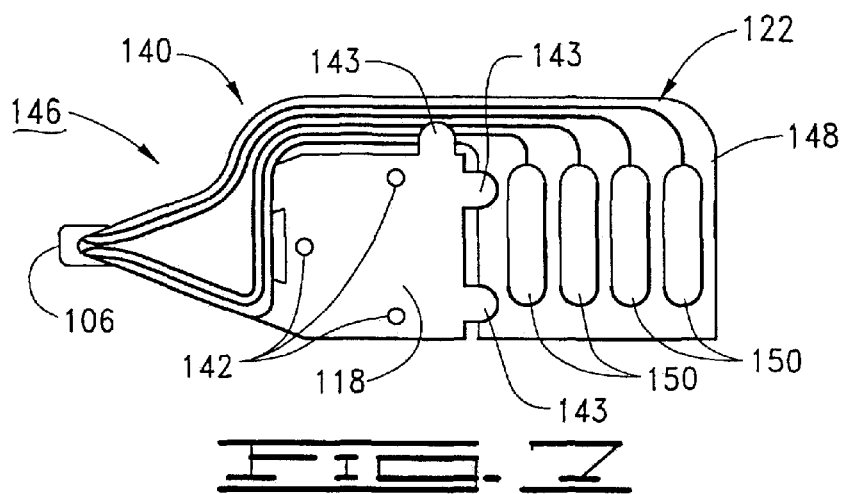
FIG. 7 provides a plan schematic view of an HGA constructed in accordance with another preferred embodiment of the present invention.
Figure 8:
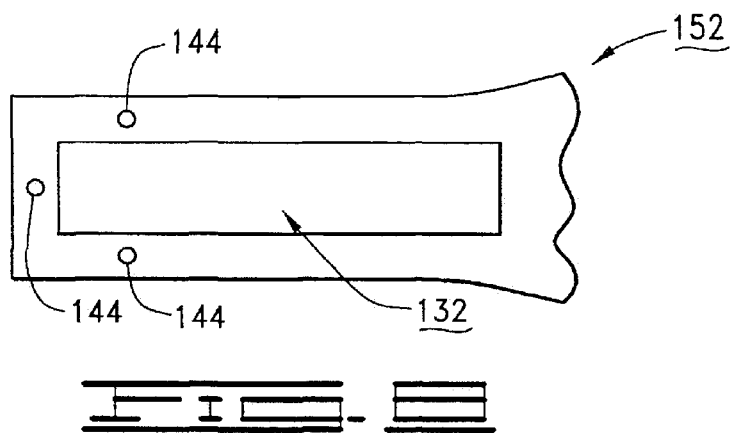
FIG. 8 is a plan schematic view of the distal end of a PCB actuator arm constructed in accordance with another preferred embodiment of the present invention.
Figure 9:
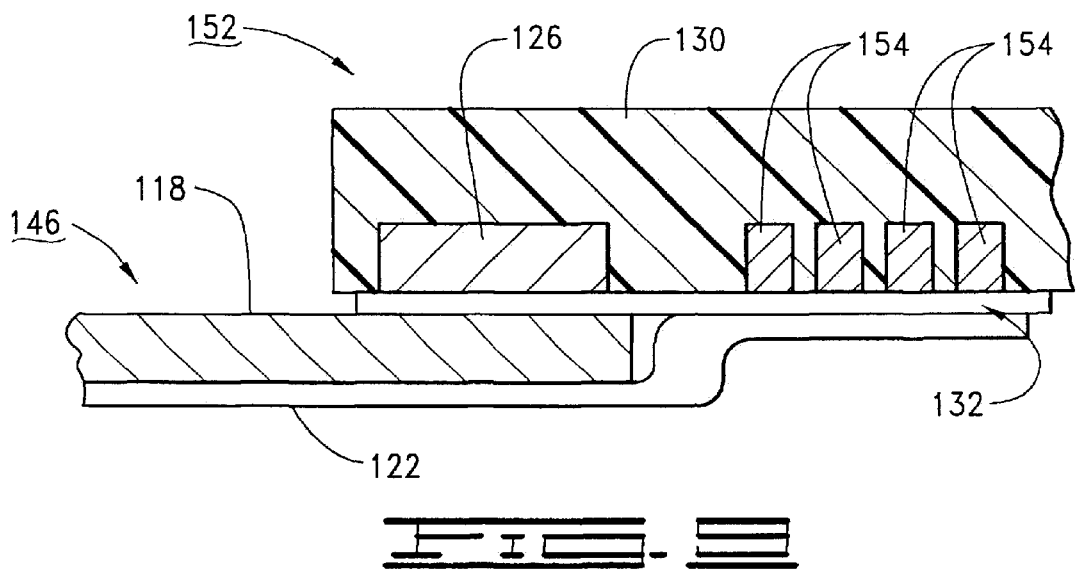
FIG. 9 is an elevational, cross-sectional view of the HGA of FIG. 7 mated to the PCB actuator arm of FIG. 8 using the Z-axis conductive adhesive.

It will be noted that the conductive path established by the film 132 as discussed above is an electrical grounding path between the HGA 124 and the actuator arm 120. FIGS. 7–9 illustrate another embodiment of the present invention wherein the Z-axis film 132 is further used to establish electrical signal paths for the heads 106.

FIG. 7 provides a top plan view of an HGA (numerically designated at 146) which is similar to the HGA 124 except that the flex circuit 122 has a portion 148 that terminates closely behind the flexure 118 instead of extending along the length of the actuator arm. The portion 148 includes exposed pads 150 that are in electrical connection with the traces 140 of the flex circuit.

FIG. 8 provides a bottom plan view of a PCB actuator arm (numerically designated at 152) similar to the actuator arm 120 discussed above and includes contacts (pads) 154 with associated traces (not shown) that run the length of the actuator arm. The pads 154 of the actuator arm 152 are brought into electrical connection with the pads 150 of the HGA 146 as shown in FIG. 9 to provide the desired electrical interconnections between the read and write elements of the head 106 and the preamplifier/driver circuitry. As before, an electrical grounding path is also established by a portion of the film 132 between the flexure 118 and pad 126.

While the respective embodiments of FIGS. 3–6 and 7–9 only contemplate a single HGA 124, 146 affixed to the distal end of the actuator arm 120, 152, it will be readily understood that the foregoing embodiments can readily be adapted for use between adjacent discs 104 so that the arms support opposing top and bottom HGAs.

Figure 10:
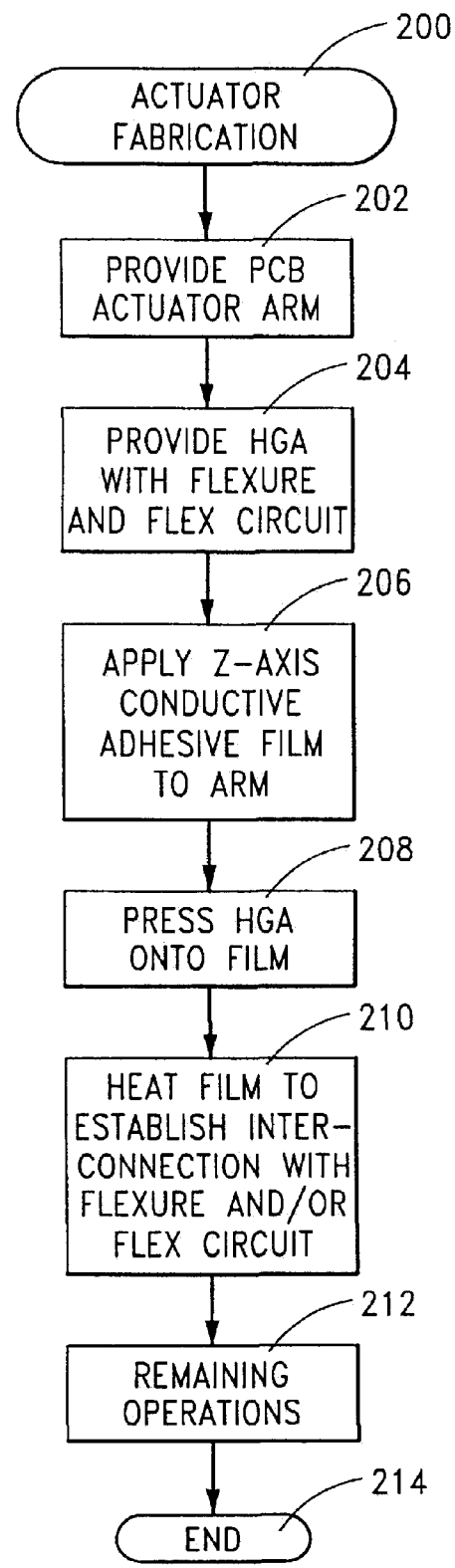
FIG. 10 is a flow chart for an ACTUATOR FABRICATION routine generally illustrative of steps carried out to fabricate an actuator in accordance with preferred embodiments of the present invention.

FIG. 10 provides a flow chart for an ACTUATOR FABRICATION routine 200 illustrative of steps carried out in accordance with preferred embodiments to form an actuator assembly. It is contemplated that the routine of FIG. 10 can readily be adapted for use in an automated manufacturing environment where computer controlled, robotic arms manipulate the various components.

A PCB actuator arm (such as 120, 152) is provided at step 202 and an HGA (such as 124, 146) is provided at step 204. A suitable layer of Z-axis conductive adhesive film (such as 132) is applied to the actuator arm at step 206 to cover the associated exposed pads (such as 126, 154) in the actuator arm. It will be noted that the application of the adhesive film during this step does not have to be excessively precise; adequate interconnectivity can be achieved with a fair amount of acceptable tolerance in the placement of the film. This advantageously reduces the cost and complexity of the manufacturing process.

The HGA is brought into alignment with and pressed onto the film at step 208 and the film is heated at step 210 to cause the dielectric layer 136 to flow and ensure good contact between opposing surfaces and the embedded conductive particles 134. It will be noted that steps 208 and 210 can be carried out to affix the flexure 118 of the HGA 124 to the PCB actuator arm 120, 152, to affix the flex circuit 122 of the HGA 124 to the PCB actuator arm 152, or both.

Once the desired mechanical and electrical interconnections are established at step 208, the routine continues to step 212 wherein remaining operations are performed to complete the assembled actuator 110. Such operations can include stacking and clamping the arms, using an overmold process to mold the arms in place, installation of the bearing shaft assembly, etc. Once the completed actuator is fabricated, the routine ends at step 214.

Test Results

Figure 11:
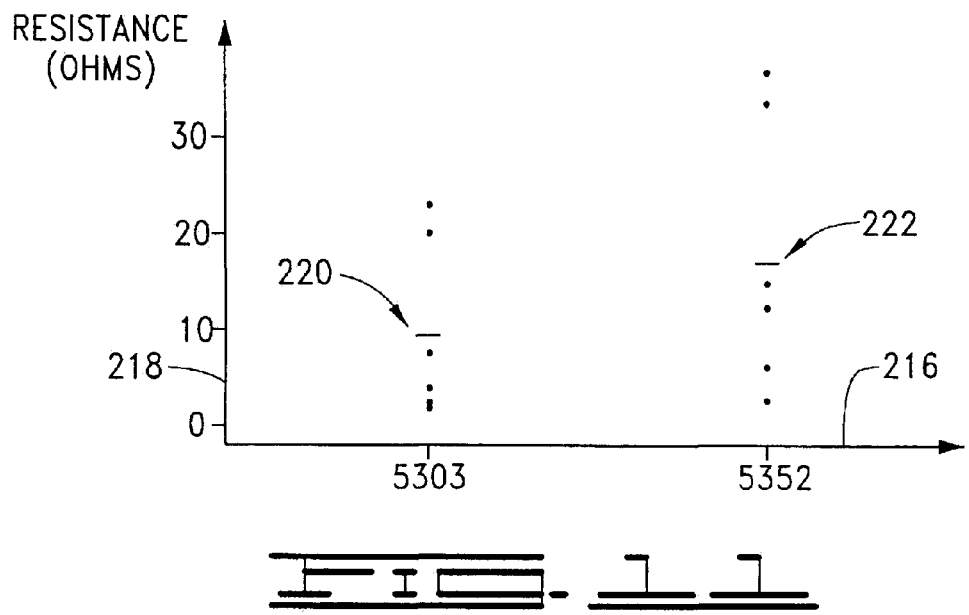
FIG. 11 is a plot of contact resistance for two models of Z-axis adhesive film.

Mechanical and electrical tests were performed to evaluate the feasibility of two types of Z-axis conductive adhesive film, namely the aforementioned models 5303 and 5352 available from 3M. FIG. 11 provides a graphical representation of contact resistance between the copper pad 126 and the flexure 118 (i.e., the resistance across the Z-axis adhesive film). In FIG. 11, the data for various samples prepared with the respective types of film are plotted along the horizontal axis 216 and the associated resistance measurements for the samples are plotted along the vertical axis 218. For reference, the mean (average) values are respectively indicated at 220, 222.

The mean resistance for the model 5303 Z-axis adhesive film is approximately 9 ohms and the mean resistance for the 5352 film is approximately 17 ohms. These values compare favorably to the conductivity of a typical swage connection (for grounding purposes) and are also contemplated as being sufficient for electrical signal interconnection as shown in FIGS. 7–9.

Figure 12:
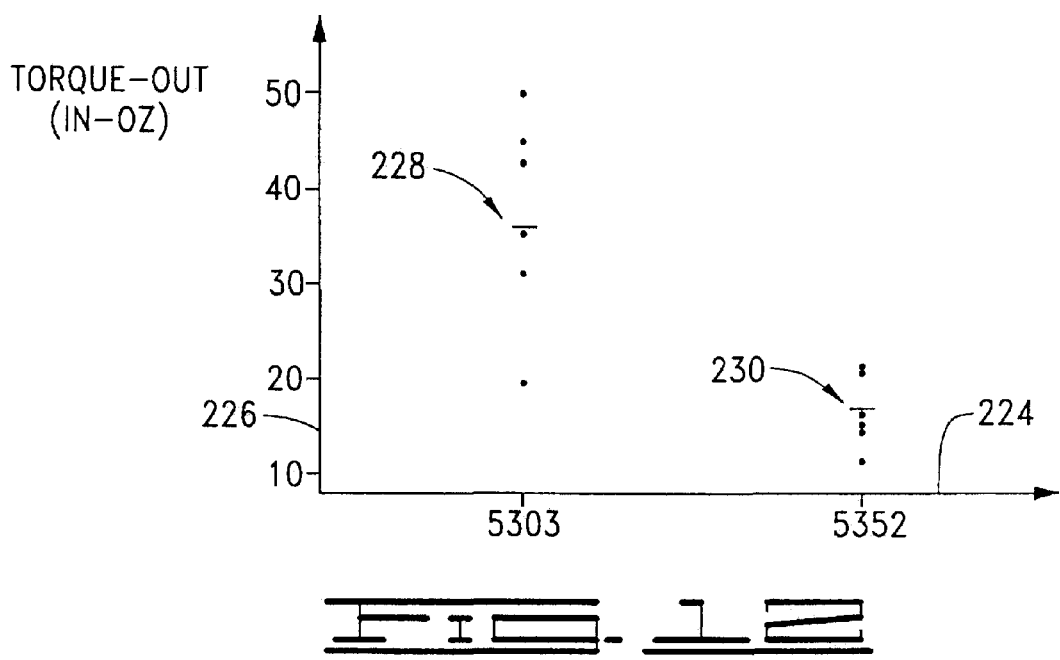
FIG. 12 is a plot of head gimbal assembly torque-out data for head gimbal assemblies bonded to a printed circuit board actuator.

FIG. 12 shows a similar graphical illustration of mechanical test results for the 5303 and 5352 films in terms of torque-out values (in inch-ounces). The respective models are plotted along the horizontal axis 224 and the resulting torque-out values are plotted along the vertical axis 226. As will be recognized, torque-out is a measure of the torque required to rotate the flexure with respect to the actuator arm; thus, the torque-out values in FIG. 12 are correlated to the bond strength of the respective films. It is desirable to have a large torque-out value so that the HGA will remain affixed to the actuator arm.

In FIG. 12, the mean torque-out value is about 36 inch-ounces for the model 5303 film (as indicated at 228) and about 16 inch-ounces for the model 5352 film (as indicated at 230). Both of these films compare favorably to the mechanical strength of a typical swage connection, which typically has a torque-out value in the 10–15 inch-ounce range. Thus, it is contemplated that both of the films 5303 and 5352 will provide excellent mechanical and electrical performance and both films are well suited for the purposes described hereinabove.

It will now be understood that the present invention (as embodied herein and as claimed below) is directed to an apparatus and method for forming a disc drive actuator assembly. In accordance with preferred embodiments, a disc drive (such as 100) includes at least one rotatable disc (such as 104) and an actuator assembly (such as 105) adjacent the discs. The actuator assembly includes a rigid printed circuit board (PCB) actuator arm (such as 120, 152) formed of a printed circuit board material, and a flexible head-gimbal assembly (HGA, such as 124, 146). The HGA preferably comprises a data transducing head (such as 106), a flexible suspension assembly (such as 118) and a flex circuit (such as 122) including a conductor (such as 140) which is routed along the flexible suspension assembly and connected to the head.

A Z-axis conductive adhesive film (such as 132) is used to electrically and mechanically attach the HGA to a distal end of the PCB actuator arm. The film provides a low resistance electrically conductive path in a first direction across the layer from the HGA to the actuator arm, and at the same time is substantially nonconductive in a second direction normal to the first direction.

In a preferred embodiment, the Z-axis conductive adhesive film is used to affix the flexible suspension assembly to the actuator arm to provide a grounding path to dissipate electrostatic charge in the HGA (such as illustrated in FIGS. 3–6, 7–9). In another preferred embodiment, the Z-axis conductive adhesive film is used to affix the flex circuit to the actuator arm to provide a data signal path for the head (such as illustrated in FIGS. 7–9).

The actuator assembly is preferably formed by steps of providing the PCB actuator arm (such as by step 202) and the HGA (such as by step 204), applying the Z-axis conductive adhesive film to at least a selected one of the PCB actuator arm and the HGA (such as by step 206), pressing the HGA onto the PCB actuator arm (such as by step (208), and heating the film to establish the mechanical and electrical interconnection between the HGA and the PCB actuator arm (such as by step 210).

For purposes of the appended claims, the recited function performed by the recited "first means" will be understood as being carried out by the disclosed Z-axis adhesive film 132. Prior art structures that connect an HGA to an actuator arm, such as the swaging technique disclosed by the aforementioned Coon reference, are explicitly excluded from the scope of the claim and are further explicitly excluded from the definition of an equivalent structure.

For purposes of the appended claims, reference to low resistance and substantially conductive will be understood as providing a path with a resistance of 50 ohms or less.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application of the actuator arm and head gimbal assembly without departing from the spirit and scope of the present invention.

In addition, although the embodiments described herein are directed to an actuator arm and head gimbal assembly for a disc drive actuator assembly, it will be appreciated by those skilled in the art that the actuator arm and the head gimbal assembly can be used for other devices without departing from the spirit and scope of the claimed invention.

What is claimed is:

1. An actuator assembly for a disc drive, comprising:
    a rigid printed circuit board (PCB) actuator arm formed of a printed circuit board material; and
    a cantilevered, flexible head-gimbal assembly (HGA) mechanically attached to the actuator arm solely by a layer of Z-axis conductive adhesive film, wherein the Z-axis conductive adhesive film provides a low resistance electrically conductive path in a first direction across the layer from the HGA to the actuator arm, and wherein the Z-axis conductive adhesive film is substantially nonconductive in a second direction normal to the first direction.

2. The actuator assembly of claim 1, wherein the HGA comprises a flexible suspension assembly which supports a data transducing head, wherein the PCB actuator arm comprises an exposed conductive pad supported by a dielectric substrate, and wherein the Z-axis conductive adhesive film interconnects the flexible suspension assembly with the exposed conductive pad to provide an electrical grounding path to dissipate the buildup of electrostatic charge in the HGA.

3. The actuator assembly of claim 2, wherein the HGA further comprises a flex circuit routed along the flexible suspension assembly, the flex circuit having an electrical conductor connected to the data transducing head and an exposed conductive pad connected to the electrical conductor, wherein the PCB actuator arm comprises a second exposed conductive pad supported by a dielectric substrate, and wherein the Z-axis conductive adhesive film further interconnects the exposed conductive pad of the flex circuit with the second exposed conductive pad of the PCB actuator arm to establish a signal path for the data transducing head.

4. The actuator assembly of claim 1, wherein the HGA comprises a flexible suspension assembly which supports a data transducing head and a flex circuit routed along the flexible suspension assembly, the flex circuit having an electrical conductor connected to the read/write head and an exposed conductive pad connected to the electrical conductor, wherein the PCB actuator arm comprises an exposed conductive pad supported by a dielectric substrate, and wherein the Z-axis conductive adhesive film interconnects the exposed conductive pad of the flex circuit with the exposed conductive pad of the PCB actuator arm to establish a signal path for the data transducing head.

5. The actuator assembly of claim 1, wherein the Z-axis adhesive film contains electrically conductive particles suspended in a dielectric layer.

6. The actuator assembly of claim 5, wherein the dielectric layer comprises a thermoplastic material, a thermoset material, or a combination thereof.

7. The actuator assembly of claim 1, wherein the PCB actuator arm comprises glass-epoxy resin.

8. The actuator assembly of claim 1, wherein the PCB actuator arm comprises a dielectric substrate which supports an embedded electrically conductive trace electrically connected to the Z-axis conductive adhesive film.

9. A disc drive, comprising:
    a rotatable disc; and
    an actuator assembly adjacent the disc, comprising:
        a rigid printed circuit board (PCB) actuator arm formed of a printed circuit board material; and
        a cantilevered, flexible head-gimbal assembly (HGA) mechanically attached to the actuator arm solely by a layer of Z-axis conductive adhesive film, wherein the Z-axis conductive adhesive film provides a low resistance electrically conductive path in a first direction across the layer from the HGA to the actuator arm, and wherein the Z-axis conductive adhesive film is substantially nonconductive in a second direction normal to the first direction.

10. The disc drive of claim 9, wherein the HGA comprises a flexible suspension assembly which supports a data transducing head, wherein the PCB actuator arm comprises an exposed conductive pad supported by a dielectric substrate, and wherein the Z-axis conductive adhesive film interconnects the flexible suspension assembly with the exposed conductive pad to provide an electrical grounding path to dissipate the buildup of electrostatic charge in the HGA.

11. The disc drive of claim 10, wherein the HGA further comprises a flex circuit routed along the flexible suspension assembly, the flex circuit having an electrical conductor connected to the data transducing head and an exposed conductive pad connected to the electrical conductor, wherein the PCB actuator arm comprises a second exposed conductive pad supported by a dielectric substrate, and wherein the Z-axis conductive adhesive film further interconnects the exposed conductive pad of the flex circuit with the second exposed conductive pad of the PCB actuator arm to establish a signal path for the data transducing head.

12. The disc drive of claim 9, wherein the HGA comprises a flexible suspension assembly which supports a data transducing head and a flex circuit routed along the flexible suspension assembly, the flex circuit having an electrical conductor connected to the read/write head and an exposed conductive pad connected to the electrical conductor, wherein the PCB actuator arm comprises an exposed conductive pad supported by a dielectric substrate, and wherein the Z-axis conductive adhesive film interconnects the exposed conductive pad of the flex circuit with the exposed conductive pad of the PCB actuator arm to establish a signal path for the data transducing head.

13. The disc drive of claim 9, wherein the Z-axis adhesive film contains electrically conductive particles suspended in a dielectric layer.

14. The disc drive of claim 13, wherein the dielectric layer comprises a thermoplastic material, a thermoset material, or a combination thereof.

15. The disc drive of claim 9, wherein the PCB actuator arm comprises a dielectric substrate which supports an embedded electrically conductive trace electrically connected to the Z-axis conductive adhesive film.

16. A disc drive actuator assembly, comprising:
    a head gimbal assembly (HGA) comprising a flexible suspension assembly, a transducing head and an electrical conductor connected to the head and routed along the flexible suspension assembly;

a rigid printed circuit board (PCB) actuator arm made from printed circuit board material; and first means for electrically and mechanically attaching the HGA to the PCB actuator arm.

17. The disc drive actuator assembly of claim 16, wherein the first means comprises a layer of Z-axis conductive adhesive film which provides a low resistance electrically conductive path in a first direction across the layer from the HGA to the actuator arm, wherein the Z-axis conductive adhesive film is substantially nonconductive in a second direction normal to the first direction, and wherein the Z-axis conductive adhesive film is the sole attachment mechanism used to mechanically support the HGA in a cantilevered fashion with respect to the PCB.

18. The disc drive actuator assembly of claim 17, wherein the PCB actuator arm comprises an exposed conductive pad supported by a dielectric substrate, and wherein the Z-axis conductive adhesive film interconnects the flexible suspension assembly with the exposed conductive pad to provide an electrical grounding path to dissipate the buildup of electrostatic charge in the HGA.

19. The disc drive actuator assembly of claim 18, wherein the PCB actuator arm comprises a second exposed conductive pad supported by a dielectric substrate, and wherein the Z-axis conductive adhesive film further interconnects the electrical conductor of the HGA with the second exposed conductive pad of the PCB actuator arm to establish a signal path for the data transducing head.

20. The disc drive actuator assembly of claim 17, wherein the PCB actuator arm comprises an exposed conductive pad supported by a dielectric substrate, and wherein the Z-axis conductive adhesive film interconnects the electrical conductor of the HGA with the exposed conductive pad of the PCB actuator arm to establish a signal path for the data transducing head.

21. A method for forming a disc drive actuator assembly, comprising steps of:

(a) providing a rigid printed circuit board (PCB) actuator arm formed of a printed circuit board material, the PCB actuator arm having an exposed electrically conductive pad supported by a dielectric substrate;

(b) providing a flexible head-gimbal assembly (HGA) comprising a data transducing head, a flexible suspension assembly which supports the head and an electrical conductor connected to the head and routed along the flexible suspension assembly;

(c) applying a layer of Z-axis conductive adhesive film to at least a selected one of the HGA and the electrically conductive pad of the PCB actuator arm; and (d) mating the PCB actuator arm and the HGA so that the Z-axis conductive adhesive film solely electrically and mechanically interconnects the PCB actuator arm and the HGA and so that the HGA extends in a cantilevered fashion beyond a distal extent of the PCB actuator arm, wherein the Z-axis conductive adhesive film provides a low resistance electrically conductive path in a first direction across the layer from the HGA to the electrically conductive pad of the PCB actuator arm, and wherein the Z-axis conductive adhesive film is substantially nonconductive in a second direction normal to the first direction.

22. The method of claim 21, wherein the mating step (d) comprises a step of affixing the flexible suspension assembly to the Z-axis conductive adhesive film so that an electrically conductive path is established from the electrically conductive pad of the PCB actuator arm, through the Z-axis conductive adhesive film and to the flexible suspension assembly to provide an electrical grounding path to dissipate the buildup of electrostatic charge in the HGA.

23. The disc drive of claim 21, wherein the mating step (d) comprises a step of affixing the electrical conductor of the HGA to the Z-axis conductive adhesive film so that an electrically conductive path is established from the electrically conductive pad of the PCB actuator arm, through the Z-axis conductive adhesive film, through the electrical conductor of the HGA and to the data transducing head to provide a data signal path for the head.

24. The disc drive of claim 21, wherein the exposed electrically conductive pad of the PCB actuator arm of step providing (a) is characterized as a first exposed electrically conductive pad, wherein the providing step (a) further comprises providing the PCB actuator arm with a second exposed electrically conductive pad that is electrically insulated from the first exposed electrically conductive pad, and wherein the mating step (d) comprises a step of affixing both the electrical conductor and the flexible suspension assembly of the HGA to the Z-axis conductive adhesive film so that a first electrically conductive path is established from the first exposed electrically conductive pad of the PCB actuator arm, through the Z-axis conductive adhesive film and to the flexible suspension assembly to facilitate the dissipation of electrostatic charge within the HGA, and so that a second electrically conductive path isolated from the first path is formed from the second exposed electrically conductive pad, through the Z-axis conductive adhesive film, through the electrical conductor of the HGA and to the data transducing head to provide a data signal path for the head.

25. The method of step 24, wherein the applying step (c) comprises a step of applying a single layer of the Z-axis conductive adhesive film to the PCB actuator arm that contacts both the first and second exposed electrically conductive pads of the PCB actuator arm.

* * * * *